(12) United States Patent
Wong et al.

(10) Patent No.: US 6,980,023 B1
(45) Date of Patent: Dec. 27, 2005

(54) DYNAMICALLY ADJUSTABLE SIGNAL DETECTOR

(75) Inventors: Wilson Wong, San Francisco, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 164 days.

(21) Appl. No.: 10/668,811

(22) Filed: Sep. 22, 2003

(51) Int. Cl.[7] .......................................... H03K 19/003
(52) U.S. Cl. ........................ 326/31; 326/14; 327/74
(58) Field of Search .... 326/14, 21, 31–33; 327/74–75, 327/77–78; 375/317–318, 287–286

(56) References Cited

U.S. PATENT DOCUMENTS

| | | | |
|---|---|---|---|
| 5,448,200 A * | 9/1995 | Fernandez et al. | 327/560 |
| 5,706,222 A * | 1/1998 | Bonaccio et al. | 708/841 |
| 6,483,886 B1 | 11/2002 | Sung et al. | 375/376 |
| 6,650,140 B2 | 11/2003 | Lee et al. | 326/39 |
| 2001/0033188 A1 | 10/2001 | Aung et al. | 327/141 |
| 2003/0052709 A1 | 3/2003 | Venkata et al. | 326/37 |

OTHER PUBLICATIONS

U.S. Appl. No. 10/059,014, filed Jan. 29, 2002, Lee et al.
U.S. Appl. No. 10/273,899, filed Oct. 16, 2002, Venkata et al.
U.S. Appl. No. 10/317,262, filed Dec. 10, 2002, Venkata et al.
U.S. Appl. No. 10/454,626, filed Jun. 3, 2003, Lui et al.
U.S. Appl. No. 10/349,541, filed Jan. 21, 2003, Venkata et al.
U.S. Appl. No. 10/637,982, filed Aug. 8, 2003, Venkata et al.

* cited by examiner

*Primary Examiner*—James H. Cho
(74) *Attorney, Agent, or Firm*—Fish & Neave IP Group of Ropes & Gray LLP; Evelyn C. Mak

(57) ABSTRACT

A dynamically adjustable signal detector receives a differential input signal and outputs a signal indicative of whether a valid signal is being received based on dynamically adjustable threshold settings. The threshold settings can include differential voltage, peak power, average power, or other suitable settings, and can have a dynamically adjustable value for a selected threshold setting. The threshold settings and the value for a selected threshold setting can be set using control signals that are set by programmable logic resource circuitry, by soft intellectual property programmed into a programmable logic resource, by a processor, by circuitry external to a programmable logic resource, or by user input.

29 Claims, 14 Drawing Sheets

DYNAMICALLY ADJUSTABLE SIGNAL DETECTOR

BACKGROUND OF THE INVENTION

This invention relates to signal detectors. More particularly, this invention relates to providing dynamically adjustable signal detectors for programmable logic resources.

Programmable logic resource technology is well known for its ability to allow a common hardware design (embodied in an integrated circuit) to be programmed to meet the needs of many different applications. Known examples of programmable logic resource technology include programmable logic devices (PLDs), complex programmable logic devices (CPLDs), and field programmable gate arrays (FPGAs).

Programmable logic resources typically include large numbers of regions of programmable logic and other resources such as memory, input/output circuits, etc., that are selectively interconnectable via programmable interconnection resources on the programmable logic resources. For example, each region of programmable logic on a programmable logic resource may be programmable to perform any of several relatively simple logic functions on several input signals applied to that region in order to produce one or more output signals indicative of the result of performing the selected logic function(s) on the input signals. The interconnection resources are programmable to convey signals to, from, and between the logic regions in any of a wide variety of patterns or configurations.

Programmable logic resources can be designed to support multiple signaling protocols. These signaling protocols vary with respect to such parameters as clock signal frequency, header configuration, packet size, data word length, number of parallel channels, etc. Such signaling protocols can include, for example, (1) industry-standard forms such is as XAUI, InfiniBand (IB), Fibre Channel (FC), Gigabit Ethernet, Packet Over SONET or POS-5, Serial RapidIO, etc., and (2) any of a wide range of non-industry-standard or "custom" forms that particular users devise for their own uses. Such custom protocols often have at least some features similar to industry-standard protocols, but deviate from industry standards in other respects.

Differential signaling circuitry is often used to provide interconnection paths between transmitters and receivers in programmable logic resources. A transmitter includes a differential driver circuit for converting a single input signal to a pair of differential signals. Two conductors are used to convey the differential signals from the driver circuit to a receiver. The receiver includes a differential receiver circuit for converting the pair of differential signals back to a single signal for output to digital circuitry or analog circuitry.

A signal detector is often used in the differential receiver circuit to determine whether the differential signals being received from the transmitter are valid. To determine the validity of a differential signal, a differential input voltage ($V_{ID}$) is computed and compared to a minimum differential voltage ($V_{MIN}$). The differential input voltage is a difference between the positive terminal and the negative terminal of the differential signal. The minimum differential voltage is a fixed value generally associated with a given signaling protocol. The differential signal is valid when the differential input voltage is greater than or equal to the minimum differential voltage (e.g., $V_{ID} \geq V_{MIN}$).

Because known signal detectors are designed to operate for a given signaling protocol, a signal detector cannot be changed in order to support a different signaling protocol. Furthermore, changes can occur in the link between the transmitter and the receiver that can result in the minimum differential voltage being less effective in determining whether a differential signal is valid. Such changes, which can be due to component aging or environmental conditions (e.g., changes in temperature or voltage), can be classified as minor or serious. A minor change to the link can cause the differential input voltage to no longer meets the minimum differential voltage. However, the receiver may be able to tolerate a smaller minimum differential voltage while continuing to allow the system to operate reliably. A major change to the link can cause the differential input voltage to change too often or can cause the minimum differential voltage to be too small to be effective in determining whether a differential signal is valid.

In view of the foregoing, it would be desirable to provide a dynamically adjustable signal detector that supports different signaling protocols and adapts to changes in the link between the transmitter and receiver.

SUMMARY OF THE INVENTION

In accordance with the invention, a dynamically adjustable signal detector is provided on a programmable logic resource. The signal detector can be dynamically adjustable with one or more different threshold settings including, for example, differential voltage, peak power, average power, or other suitable settings. The threshold settings can be used to signal when the differential signal being received from the transmitter is valid. The value for a selected threshold setting (e.g., minimum threshold value, maximum threshold value, threshold range) can also be dynamically adjustable. The threshold settings and the value for a selected threshold setting can be set using control signals that are set by programmable logic resource circuitry, by soft intellectual property programmed into a programmable logic resource, by a processor, by circuitry external to a programmable logic resource, or by user input. The threshold settings and the value for a selected threshold setting can be changed in response to detecting a change in the signaling protocol, in response to detecting a change in the link between the transmitter and receiver, in response to detecting any other suitable event, or at any other suitable time.

In one embodiment, the threshold setting in the signal detector can include a minimum differential voltage ($V_{MIN}$). A differential input voltage ($V_{ID}$) that is greater than or equal to the minimum differential voltage is indicative of a valid signal, which can be output. A differential input voltage that is less than the minimum differential voltage is indicative of an invalid signal, which can be shown by sending a 'False' signal (e.g., logic 0) as the output.

In another embodiment, the threshold settings in the signal detector can include a minimum differential voltage ($V_{MIN}$) and one or more predetermined time periods. The signal detector initially outputs a 'True' signal only after the differential input voltage is greater than or equal to the minimum differential voltage for a predetermined time period. The signal detector initially outputs a 'False' signal only after the differential input voltage is less than the minimum differential voltage for a predetermined time period.

In yet another embodiment, the threshold settings in the signal detector can include a minimum differential voltage ($V_{MIN\_ON}$) and a maximum differential voltage ($V_{MAX\_OFF}$) (e.g., where $V_{MIN\_ON} > V_{MAX\_OFF}$). A differential input voltage that is greater than or equal to the minimum differential voltage is indicative of a valid signal. Once the signal detector indicates a valid signal, which can be shown by sending a 'True' signal (e.g., logic 1) as the output, the differential signal remains valid as long as the differential voltage is greater than the maximum differential voltage. A differential input voltage that is less than or equal to the maximum differential voltage is indicative of an invalid signal. Once the signal detector indicates an invalid signal, which can be shown by sending a 'False' signal (e.g., logic 0) as the output, the differential signal remains invalid as long as the differential input voltage is less than the minimum differential voltage.

In a further embodiment, the threshold settings in the signal detector can include a minimum differential voltage ($V_{MIN\_ON}$), a maximum differential voltage ($V_{MAX\_OFF}$), and one or more predetermined time periods. The signal detector initially outputs a 'True' signal only after the differential input voltage is greater than or equal to the minimum differential voltage for a predetermined time period, and continues to output the 'True' signal as long as the differential input voltage is greater than the maximum differential voltage. The signal detector initially outputs a 'False' signal only after the differential input voltage is less than or equal to the maximum differential voltage for a predetermined time period, and continues to output the 'False' signal as long as the differential input voltage is less than the minimum differential voltage.

The output of the signal detector is sent as input to analog circuitry or digital circuitry. Upon receiving an input signal indicative of valid data, the analog circuitry or digital circuitry can be designed to receive and process data. Upon receiving an input signal indicative of invalid data, the analog circuitry or digital circuitry can be designed to reset the circuitry, to change to a different mode of operation, or to wait until a valid signal is detected before receiving and processing data.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION

Figure 1:
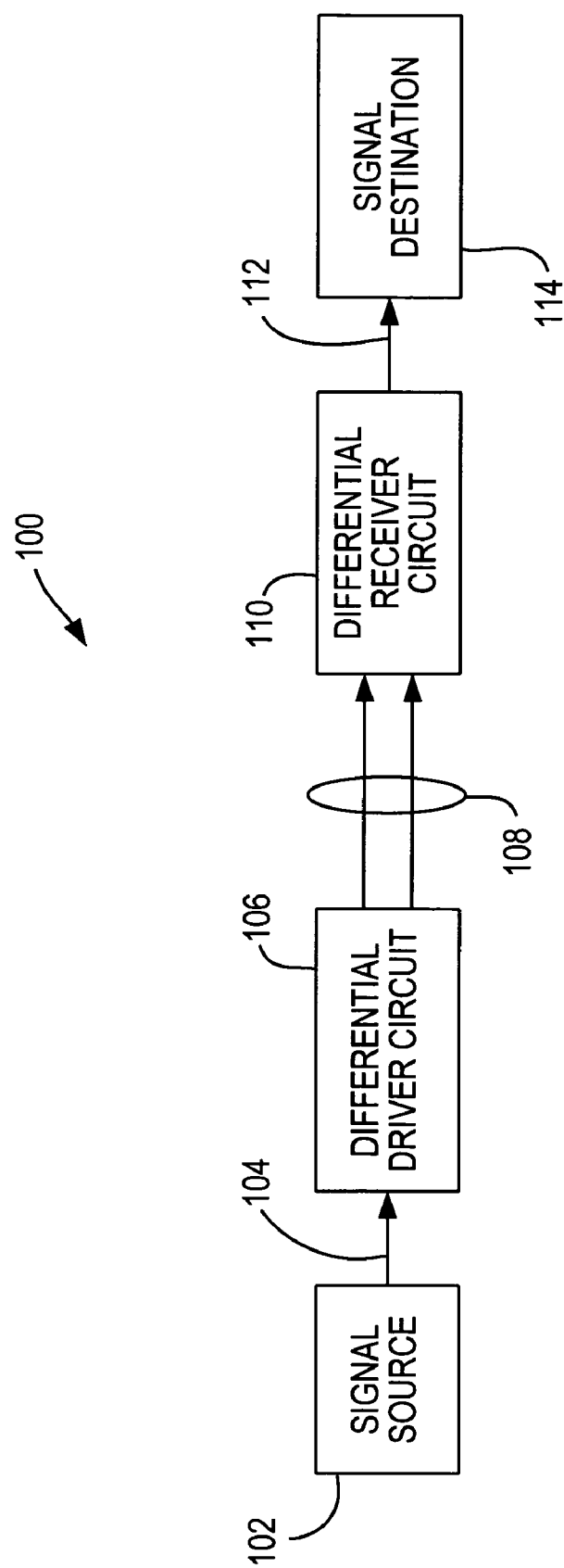
FIG. 1 is a simplified block diagram of illustrative differential signaling circuitry in accordance with an embodiment of the invention.

FIG. 1 shows illustrative differential signaling circuitry 100 which may be on a same integrated circuit or on portions of separate integrated circuits or circuit assemblies. On the transmitter side, a signal source 102, which can be any suitable signal source, produces a signal 104 that is applied to a differential driver circuit 106. Circuit 106 converts signal 104 from a single-conductor form to a differential form using two conductors that make up signals 108. Circuit 106 can include a pre-emphasis circuit and a transmitter signal detector, which can both be dynamically adjustable. A pre-emphasis circuit applies a filtering technique to boost the high frequency components of input signal 104. Signals that are transmitted from a transmitter to a receiver often go through attenuation, with higher frequency signals having greater attenuation. To preserve the validity of signals by the time the signals reach the receiver, the signals often go through a pre-emphasis circuit at the transmitter to amplify the high frequency components of the signals. A transmitter signal detector determines when a differential signal is suitable for transmission to a receiver. The differential signal can be compared to a threshold setting which can be indicative of whether the differential signal is valid for output as signals 108.

Signals 108 are transmitted to the receiver side which includes a differential receiver circuit 110. Circuit 110 converts signals 108 from a differential form back to a single-conductor form as signal 112. Circuit 110 can also include an equalization circuit and a receiver signal detector, which can both be dynamically adjustable. An equalization circuit, similar to the pre-emphasis circuit, boosts high frequency components of signals 108 to account for attenuation occurring during the transmission. A receiver signal detector, similar to a transmitter signal detector, and which is described in more detail below, determines when a valid signal has been received from the transmitter.

Signal 112 is applied to a signal destination 114 which can include, for example, digital circuitry or analog circuitry. Upon receiving an input signal indicative of valid data, the analog circuitry or digital circuitry can receive as input the valid data for processing. Upon receiving an input signal indicative of invalid data, the analog circuitry or the digital circuitry can be designed to reset the circuitry, to change to a different mode of operation, or to wait until a valid signal is detected before trying to accept and process data.

In one embodiment, the severity of signal 112 can be determined and used to characterize a given threshold setting. For example, the circuitry can include an algorithm for detecting an invalid signal and determining how far signal 112 is from the value for a given threshold setting. Alternatively or additionally, signal 112 can be used to determine and set a new value for a given threshold setting. The new value can be a minimum value in which an acceptable differential input voltage can still be obtained.

In another embodiment, for example, the analog circuitry can be clock data recovery (CDR) circuitry. The CDR circuitry receives as input a CDR data signal that includes data information and a clock signal for the data information embedded in the data information. The CDR circuitry uses a reference clock signal, which has a known frequency relationship to the clock frequency of the CDR data signal, and the CDR data signal to recover the embedded clock signal and the data information from the CDR data signal. The CDR circuitry processes data in one of two modes of operation: reference clock mode and data mode. During reference clock mode, the CDR circuitry uses the reference clock signal to train the voltage controlled oscillator (VCO) frequency to produce a recovered clock that is similar in frequency (e.g., within 100 parts per million (PPM)) to the clock signal embedded in the CDR data signal. During data mode, the CDR circuitry uses the data transitions of the CDR data signal to change the phase and frequency of the recovered clock to align to the optimal sampling point with respect to the data information in the CDR data signal. When the CDR circuitry receives a signal from circuitry 110 indicative of valid data, the CDR circuitry may be directed to process data in data mode. However, when the CDR circuitry receives a signal from circuitry 110 indicative of invalid data, the CDR circuitry may be directed to return to processing in reference clock mode.

Figure 2A:
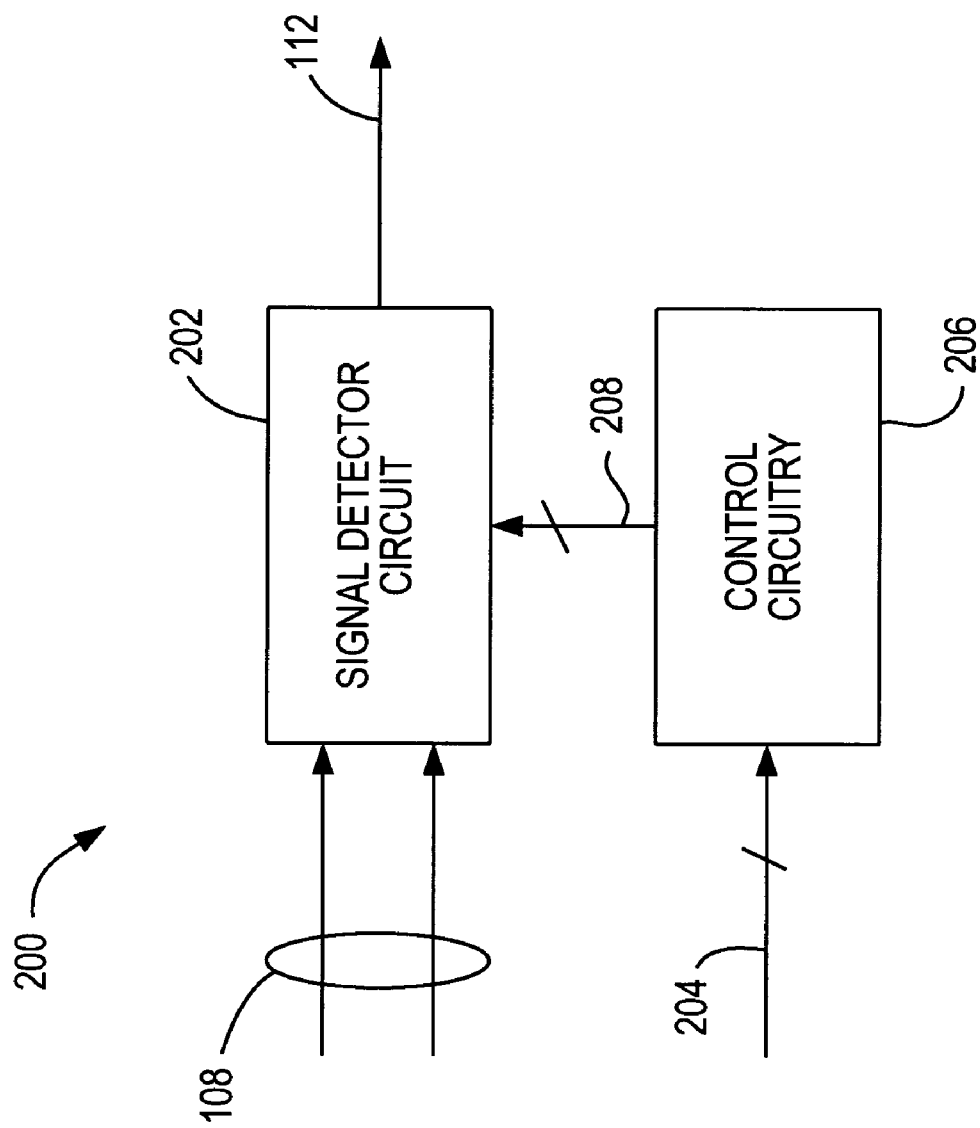
FIGS. 2A–B are simplified block diagrams of differential receiver circuits in accordance with different embodiments of the invention.

FIG. 2A shows one embodiment of a simplified block diagram of a differential receiver circuit 200 (e.g., circuit 110 in FIG. 1). Circuit 200 includes a signal detector circuit 202 and control circuitry 206. Circuit 202, which receives as input signals 108, determines whether a valid input is being received from a differential driver circuit. If valid input is being received, circuit 202 sends a 'True' signal (e.g., logic 1) as the output signal 112. If invalid input is being received, circuit 202 sends a 'False' signal (e.g., logic 0) as the output signal 112. Circuit 202 can be dynamically adjustable with one or more different threshold settings to determine when signals 108 are valid. Such threshold settings can include, for example, differential voltage, peak power, average power, or other suitable setting or combinations of settings. The value for a selected threshold setting (e.g., minimum threshold value, maximum threshold value, threshold range) can also be dynamically adjustable.

In one embodiment, circuit 202 can be set with a minimum differential voltage ($V_{MIN}$). Circuit 202 can compute a differential input voltage ($V_{ID}$) of input signals 108 by taking the difference between the positive terminal and the negative terminal of input signals 108 and comparing the differential input voltage to the minimum differential voltage. Input signals 108 are determined to be valid when the differential input voltage is greater than or equal to the minimum differential voltage (i.e., $V_{ID} \geq V_{MIN}$). Input signals 108 are determined to be invalid when the differential input voltage is less than the minimum differential voltage (i.e., $V_{ID} < V_{MIN}$). Because the differential input voltage and the minimum differential voltage can have positive and/or negative values, the absolute value of the differential input voltage and the threshold settings are used in performing the comparison. For clarity, the differential input voltage and the threshold settings are described primarily herein as having positive values.

In another embodiment, circuit 202 can be set with a minimum differential voltage ($V_{MIN}$) and one or more predetermined time periods. To prevent circuit 202 from inadvertently triggering an incorrect output due to a glitch or other problem, circuit 202 may be set to send a change in the output (e.g., from a 'True' signal to a 'False' signal or from a 'False' signal to a 'True' signal) only after a predetermined time period in which the change in output is detected. For example, input signals 108 can be determined to be valid only after the differential input voltage is greater than or equal to the minimum differential voltage (i.e., $V_{ID} \geq V_{MIN}$) for at least a predetermined time period. Input signals 108 can be determined to be invalid only after the differential input voltage is less than the minimum differential voltage (i.e., $V_{ID} < V_{MIN}$) for at least a predetermined time period. The predetermined time period to measure the valid signal and the invalid signal can be the same time period or different time periods, which can further be dynamically adjustable.

In yet another embodiment, circuit 202 can be programmed with a minimum differential voltage ($V_{MIN\_ON}$) and a maximum differential voltage ($V_{MAX\_OFF}$) (e.g., where $V_{MIN\_ON} > V_{MAX\_OFF}$), which can be used to prevent circuit 202 from inadvertently triggering an incorrect output. Circuit 202 can compute a differential input voltage of input signals 108 and compare the differential input voltage to the minimum differential voltage and the maximum differential voltage. Input signals 108 are initially determined to be valid when the differential input voltage is greater than or equal to the minimum differential voltage (i.e., $V_{ID} \geq V_{MIN\_ON}$). After input signals 108 are initially determined to be valid, input signals 108 continue to be valid as long as the differential input voltage is greater than the maximum differential voltage (i.e., $V_{ID} > V_{MAX\_OFF}$). Input signals 108 are initially determined to be invalid when the differential input voltage is less than or equal to the maximum differential voltage (i.e., $V_{ID} \leq V_{MAX\_OFF}$). After input signals 108 are initially determined to be invalid, input signals 108 continue to be invalid as long as the differential input voltage is less than the minimum differential voltage (i.e., $V_{ID} < V_{MIN\_ON}$).

In a further embodiment, circuit 202 can be set with a minimum differential voltage ($V_{MIN\_ON}$), a maximum differential voltage ($V_{MAX\_OFF}$), and one or more predetermined time periods. Input signals 108 can initially be determined to be valid only after the differential input voltage is greater than or equal to the minimum differential voltage (i.e., $V_{ID} \geq V_{MIN\_ON}$) for at least a predetermined time period. After input signals 108 are initially determined to be valid, input signals 108 continue to be valid as long as the differential input voltage is greater than the maximum differential voltage (i.e., $V_{ID} > V_{MAX\_OFF}$). Input signals 108 can initially be determined to be invalid only after the differential input voltage is less than or equal to the maximum differential voltage (i.e., $V_{ID} \leq V_{MAX\_OFF}$) for at least a predetermined time period. The predetermined time period to measure the valid signal and the invalid signal can be the same time period or different time periods, which can further be dynamically adjustable. After input signals 108 are initially determined to be invalid, input signals 108 continue to be invalid as long as the differential input voltage is less than the minimum differential voltage (i.e., $V_{ID} < V_{MIN\_ON}$).

Control circuitry 206, which receives as input control signals 204, can dynamically adjust circuit 202 with new threshold settings and a new value for a selected threshold setting via path 208. Control signals 204 may be set by programmable logic resource circuitry, by soft intellectual property programmed into a programmable logic resource, by a processor, by circuitry external to a programmable logic resource, or by user input. Controls signals 204 may be set at any suitable time or in response to any suitable condition. For example, the programmable logic resource circuitry, the soft intellectual property, or the external circuitry may be programmed to set control signals 204 to certain logic values in response to detecting predetermined conditions. Such conditions can include, for example, a change in signaling protocol, system component aging, environmental conditions (e.g., changes in temperature or voltage), a change in the link between the transmitter and receiver, a predetermined time period in which circuit 202 has not detected a valid signal, or other suitable conditions.

Control signals 204 can include signals to select or change the threshold settings, and signals to select or change the value of a selected threshold setting. In one embodiment, control signals 204 can include logic corresponding to particular threshold settings and a particular value for a selected threshold setting. In this embodiment, control circuitry 206 can include a lookup table that correlates the logic of control signals 204 to particular threshold settings and a value for a selected threshold setting. The contents of the lookup table are then sent as output 208 to circuit 202.

As an illustration, in one embodiment, if signal detector circuit 202 is programmed to determine whether input signals 108 are valid based on a minimum differential voltage and a maximum differential voltage, control signals 204 can include any suitable number of bits needed to index a number of different threshold setting values. If four signaling protocols are supported, control signals 204 can include two bits (e.g., $2^2$=4), whose different combinations each correspond to the threshold setting values associated with a given signaling protocol as shown in the following lookup table:

| Signals 202 Bits [1:0] | $V_{MIN}$—ON (mV) | $V_{MAX}$—OFF (mV) |
|---|---|---|
| 01 | 640 | 590 |
| 11 | std1_on | std1_off |
| 00 | std2_on | std2_off |
| 10 | std3_on | std3_off |

For example, control signals 204, whose values are set to binary "01," can correspond to the 10 Gigabit Ethernet XAUI signaling protocol, which can have a minimum differential voltage set to 640 millivolts (mV) and a maximum differential voltage set to 590 mV. Other values can correspond to threshold setting values for other signaling protocols. Any suitable number of signaling protocols can be supported, which may require fewer or additional control signals 204, and the same or different threshold setting values in the lookup table. Additionally or alternatively, the lookup table can also be used to set threshold setting values based on certain conditions that may be selected using control signals 204.

In another embodiment, control signals 204 can include signals that correspond to particular threshold settings. For example, each signal can be associated with one threshold condition such that when a given signal or signals are set to logic 1, control circuitry 206 directs circuit 202 to be set with the selected signal or signals. Control signals 204 can also be used to set particular values for the selected threshold settings.

In yet another embodiment, control signals 204 can include signals used to change the threshold settings by scrolling through a list of threshold settings. For example, a first signal can be used to scroll up a list (e.g., when the first signal is set to logic 1) while a second signal can be used to scroll down a list (e.g., when the second signal is set to logic 1). Control signals 204 can also include signals that can be used to increase or decrease the values for a selected threshold setting by a predetermined amount. For example, a first signal can be used to increment the value of a selected threshold setting by a predetermined amount (e.g., when the first signal is set to logic 1) while a second signal can be used to decrement the value of a selected threshold setting by a predetermined amount (e.g., when the second signal is set to logic 1). The predetermined amount used to increment or decrement the value of the selected threshold setting can be the same or different, and can be fixed or dynamically adjustable. Control signals 204 can be sent to control circuitry 206 using any other suitable approach or combination of approaches.

Figure 2B:
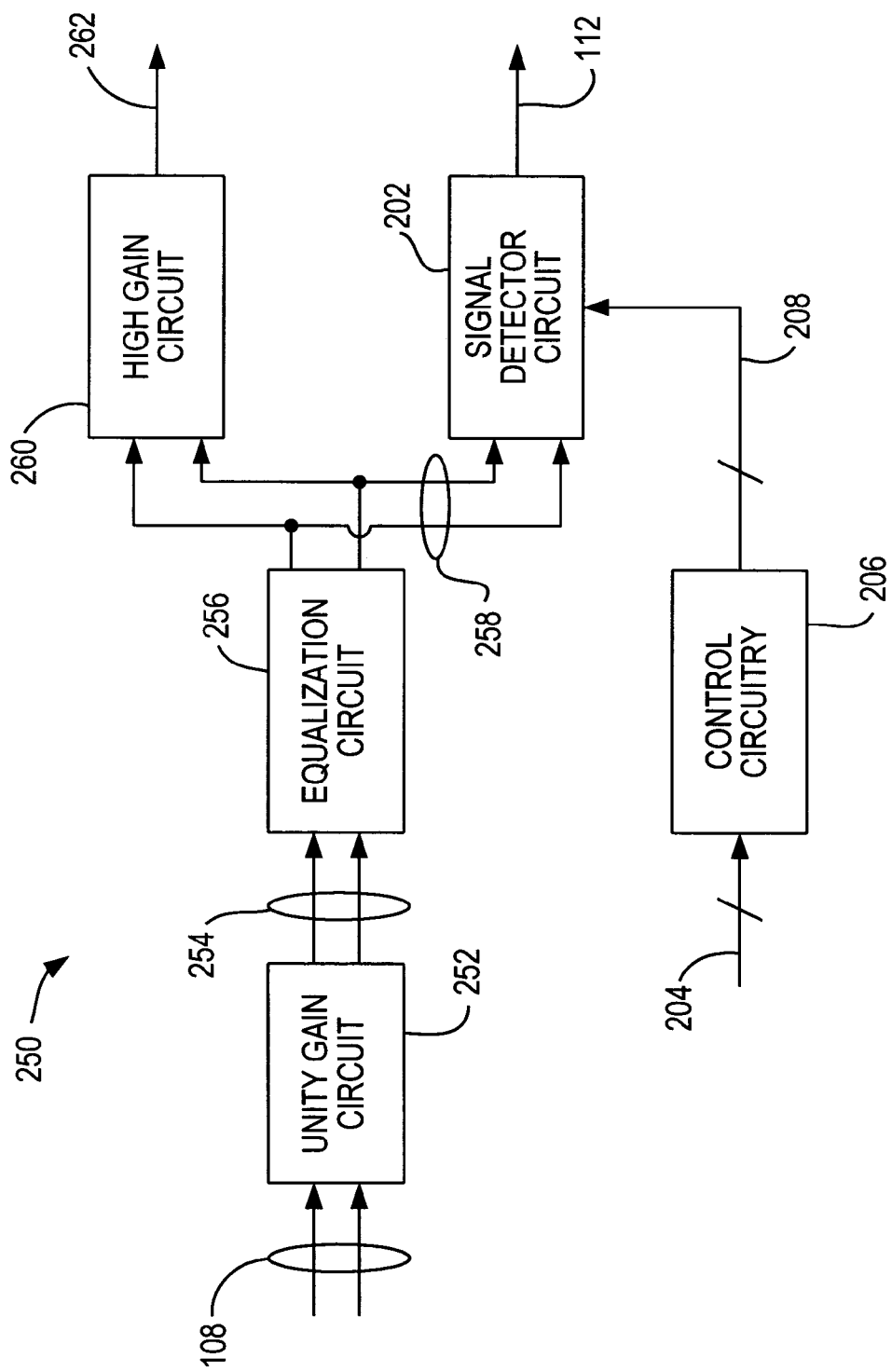

In another embodiment, rather than signals 108 being directly input to signal detector circuit 202, signals 108 can be sent to other circuitry prior to being sent as input to a signal detector circuit as shown in FIG. 2B. Differential receiver circuit 250 (e.g., circuit 110 in FIG. 1) includes a unity gain circuit 252 that receives input signals 108. Unity gain circuit 252 outputs signals 254 having a similar differential input voltage as input signals 108, and may be used to set input signals 108 at a more desirable direct current (DC) voltage level or common mode voltage level. Signals 254 are sent as input to an equalization circuit 256 that boosts high frequency components of signals 254 to account for attenuation of input signals 108 occurring during transmission to circuit 250. The output 258 of equalization circuit 256 is sent as input to a high gain circuit 260 and a signal detector circuit 202. High gain circuit 260 restores the amplitude of signals 258 and outputs a signal 262 that can be sent to signal destination 114. Signal detector circuit 202 and control circuitry 206 are similar to that described in connection with FIG. 2A. Signal detector circuit 202 can also determine the effectiveness of equalization circuit 256 and can dynamically adjust equalization circuit 256 to meet a minimum value for a given threshold setting. Alternatively, rather than having unity gain circuit 252 receive input signals 108, input signals 108 can be directly input to equalization circuit 256. In another embodiment, input signals 108 can be input to a high gain circuit, or any other suitable circuit or combination of circuits.

Figure 3A:
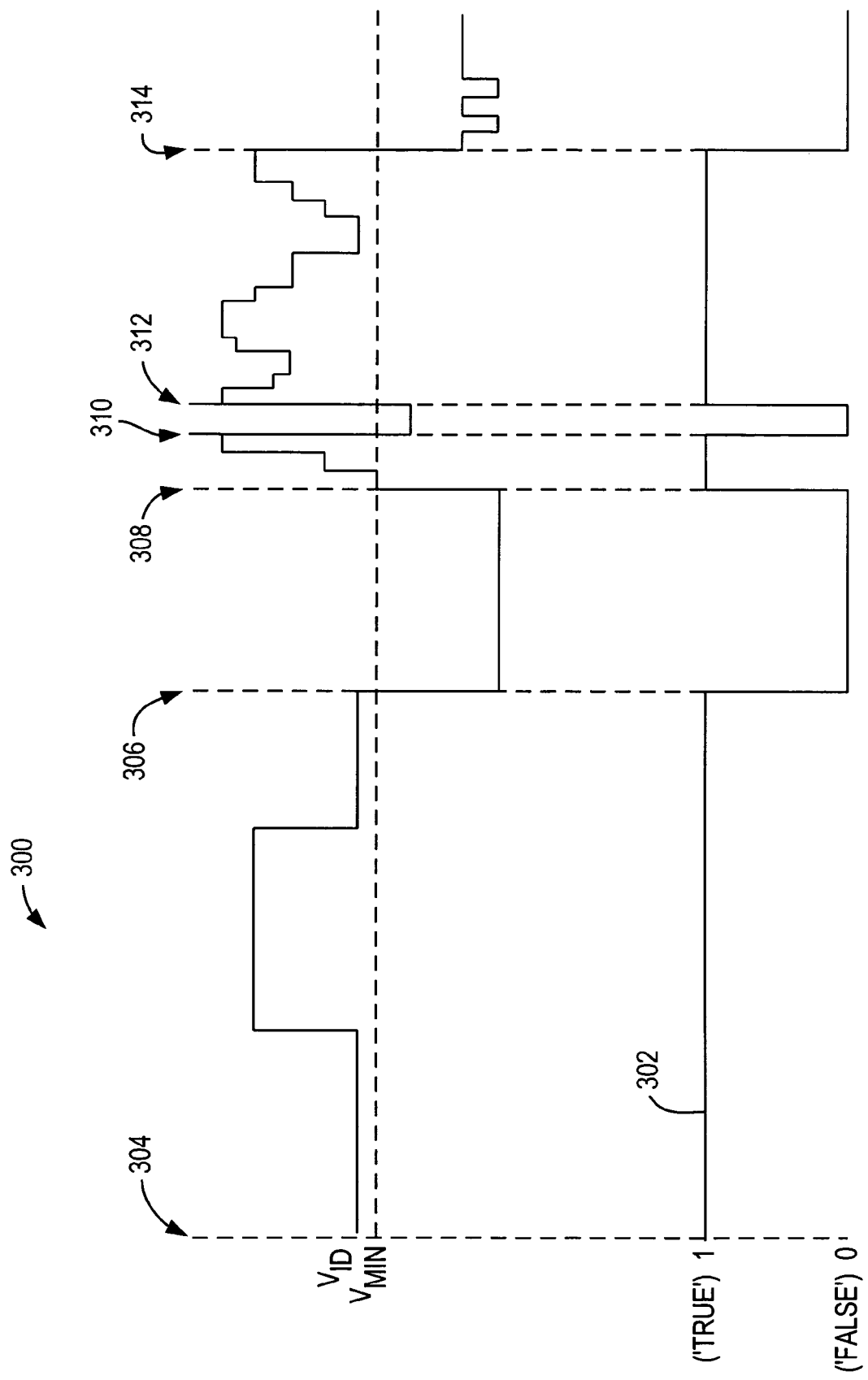
FIGS. 3A–B and 4A–B are diagrams of the output of a signal detector in accordance with different embodiments of the invention.

FIG. 3A is a diagram 300 of a differential input voltage ($V_{ID}$) signal and an output signal 302 of a signal detector circuit (e.g., signal 112 from circuit 202). The threshold setting includes a minimum differential voltage ($V_{MIN}$). At reference 304, the differential input voltage is greater than the minimum differential voltage so signal 302 is set to logic 1. While the differential input voltage continues to be greater than the minimum differential voltage, signal 302 continues to output a logic 1. At reference 306, the differential input voltage becomes less than the minimum differential voltage so signal 302 transitions from logic 1 to logic 0. While the differential input voltage remains less than the minimum differential voltage, signal 302 continues to output a logic 0. At references 308 and 312, the differential input voltage becomes greater than the minimum differential voltage so signal 302 transitions from logic 0 back to logic 1. At references 310 and 314, the differential input voltage becomes less than the minimum differential voltage so signal 302 transitions from logic 1 back to logic 0.

Figure 3B:
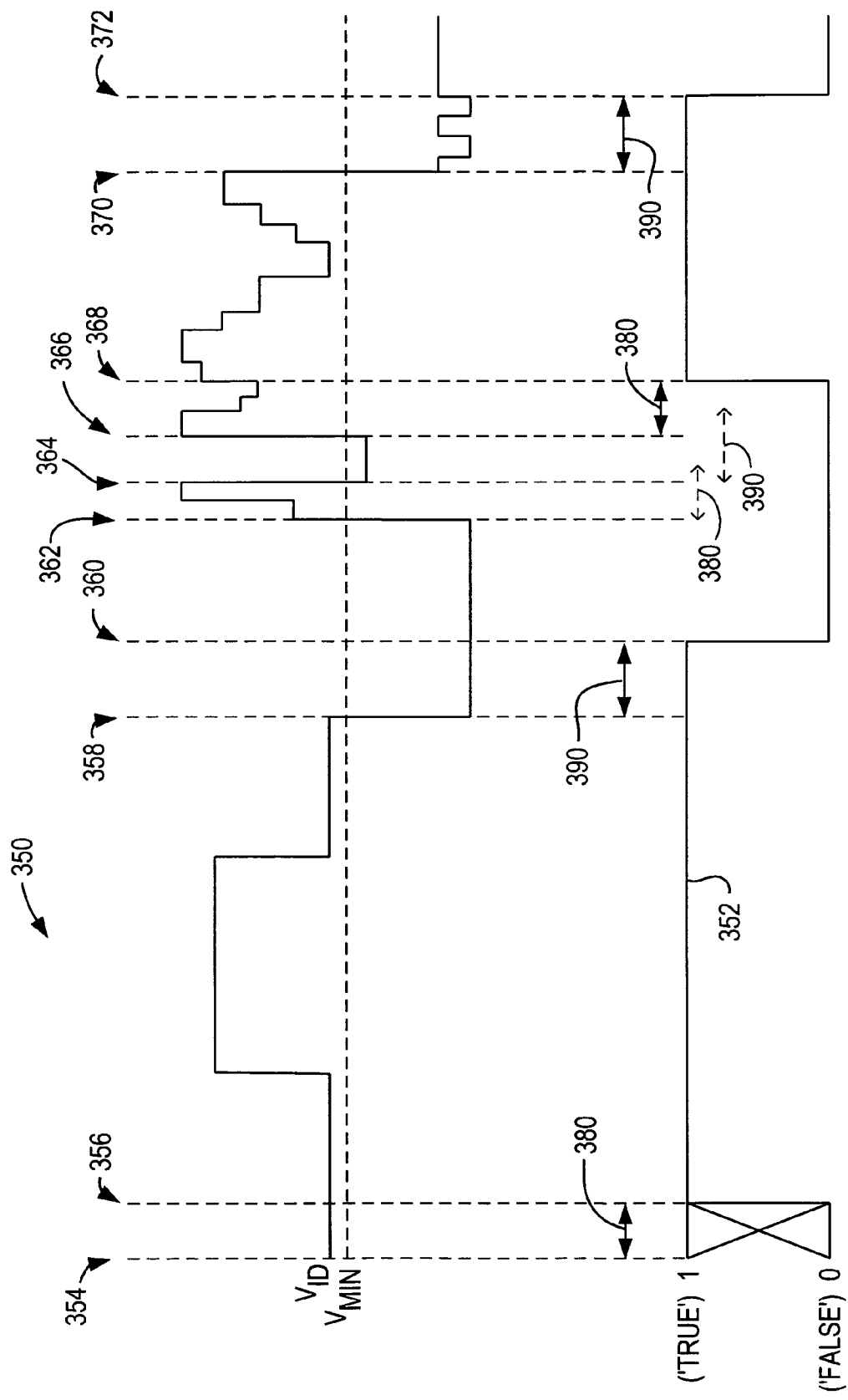

FIG. 3B is a diagram 350 of a differential input voltage ($V_{ID}$) signal and an output signal 352 of a signal detector circuit (e.g., signal 112 from circuit 202). The threshold setting includes a minimum differential voltage ($V_{MIN}$) and predetermined time periods 380 and 390. Predetermined time periods 380 can be the same or different. At reference 354, the differential input voltage initially becomes greater than the minimum differential voltage. After the predetermined time period 380 during which the differential input voltage continues to be greater than the minimum differential voltage, at reference 356, signal 352 is set to logic 1. While the differential input voltage remains greater than the minimum differential voltage, signal 352 continues to output a logic 1. At reference 358, the differential input voltage becomes less than the minimum differential voltage. After the predetermined time period 390 during which the differential input voltage continues to be less than the minimum differential voltage, at reference 360, signal 352 transitions from logic 1 to logic 0. While the differential input voltage remains less than the minimum differential voltage, signal 352 continues to output a logic 0.

At reference 362, the differential input voltage becomes greater than the minimum differential voltage. Within the predetermined time period 380, the differential input voltage becomes less than the minimum differential voltage at reference 364, so signal 352 continues to output a logic 0.

Within the predetermined time period 390, the differential input voltage becomes greater than the minimum differential voltage at reference 366, so signal 352 continues to output a logic 0. After the predetermined time period 380 during which the differential input voltage continues to be greater than the minimum differential voltage, at reference 368, signal 352 transitions from logic 0 back to logic 1. At reference 370, the differential input voltage becomes less than the minimum differential voltage. After the predetermined time period 390 during which the differential input voltage continues to be less than the minimum differential voltage, at reference 372, signal 352 transitions from logic 1 back to logic 0.

Figure 4A:
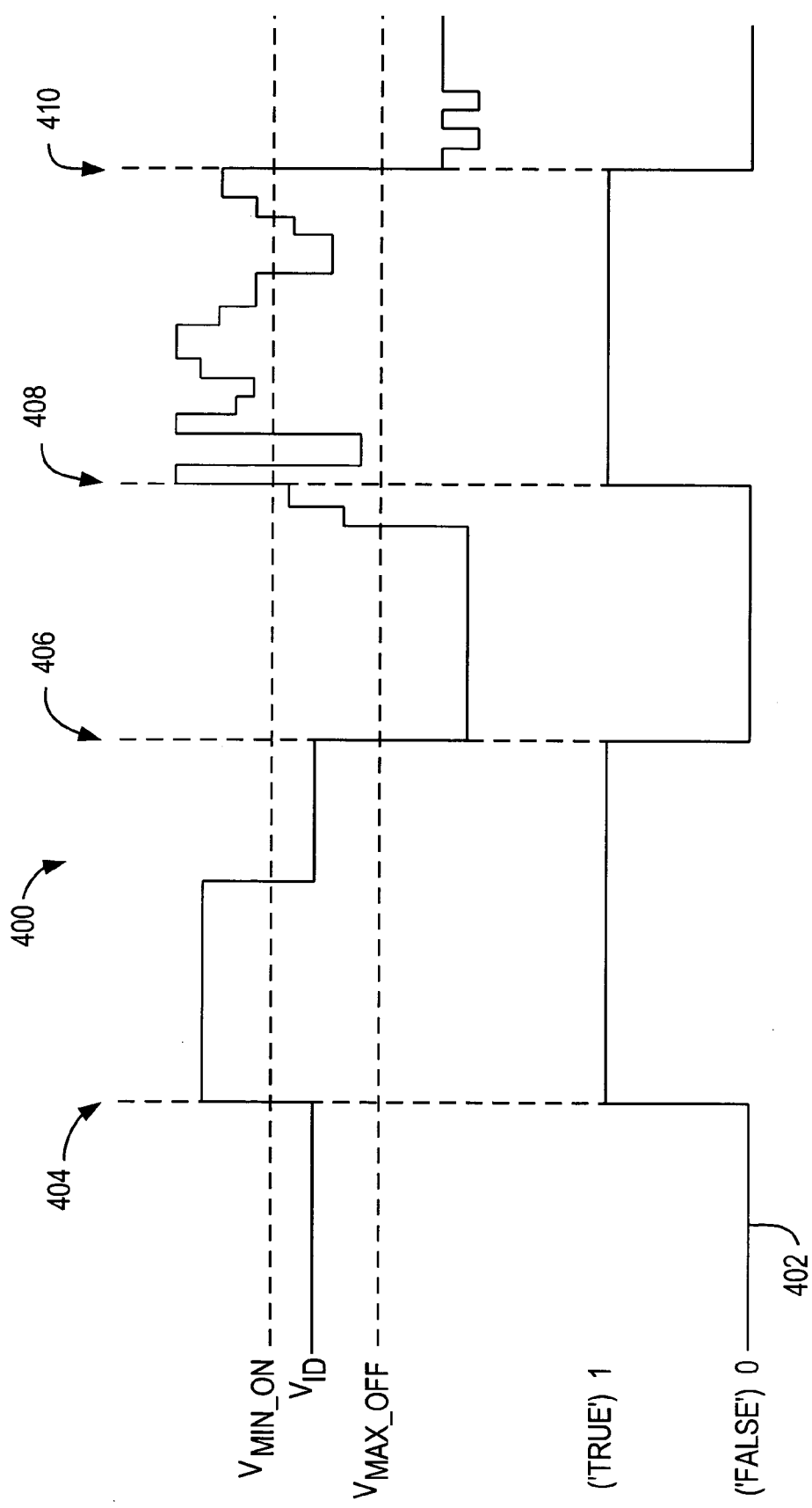

FIG. 4A is a diagram 400 of the differential input voltage ($V_{ID}$) and an output signal 402 of a signal detector circuit (e.g., signal 112 from circuit 200). The threshold settings include a minimum differential voltage ($V_{MIN\_ON}$) and a maximum differential voltage ($V_{MAX\_OFF}$). At reference 404, the differential input voltage becomes greater than the minimum differential voltage so signal 402 is set to logic 1. While the differential input voltage continues to be greater than the maximum differential voltage, signal 402 continues to output a logic 1. At reference 406, the differential input voltage becomes less than the maximum differential voltage so signal 402 transitions from logic 1 to logic 0. While the differential input voltage remains less than the minimum differential voltage, signal 402 continues to output a logic 0. At reference 408, the differential input voltage becomes greater than the minimum differential voltage so signal 402 transitions from logic 0 back to logic 1. At reference 410, the differential input voltage becomes less than the maximum differential voltage so signal 402 transitions from logic 1 back to logic 0.

Figure 4B:
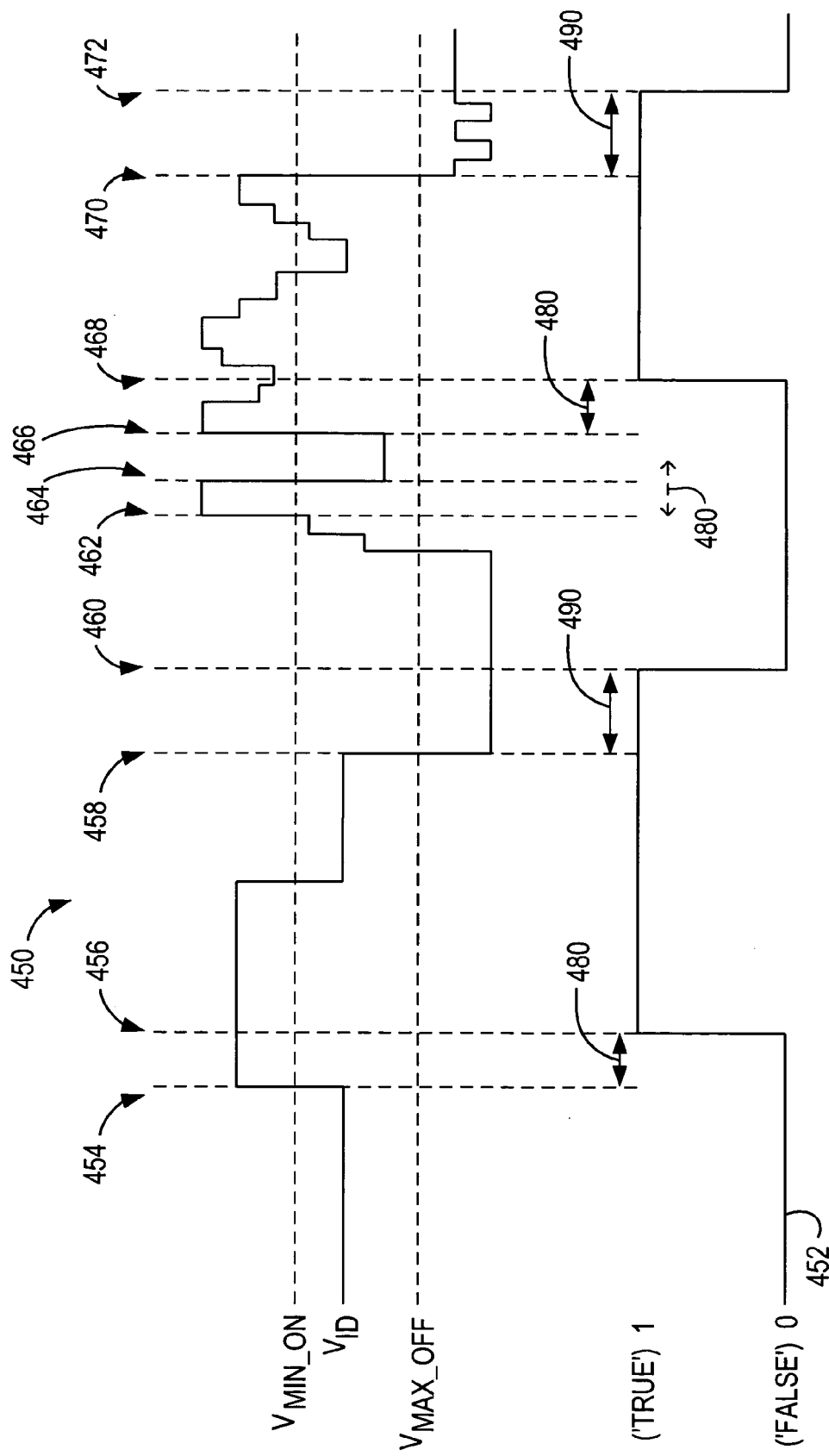

FIG. 4B is a diagram 450 of the differential input voltage ($V_{ID}$) and an output signal 452 of a signal detector circuit (e.g., signal 112 from circuit 202). The threshold settings include a minimum differential voltage ($V_{MIN\_ON}$), a maximum differential voltage ($V_{MAX\_OFF}$), and predetermined time periods 480 and 490. Predetermined time periods 480 and 490 can be the same or different. At reference 454, the differential input voltage becomes greater than minimum differential voltage. After the predetermined time period 480 during which the differential input voltage continues to be greater than the minimum differential voltage, at reference 456, signal 452 is set to logic 1. While the differential input voltage remains greater than the maximum differential voltage, signal 452 continues to output a logic 1. At reference 458, the differential input voltage becomes less than the maximum differential voltage. After the predetermined input time period 490 during which the differential input voltage continues to be less than the maximum differential voltage, at reference 460, signal 452 transitions from logic 1 back to logic 0. While the differential input voltage remains less than the minimum differential voltage, signal 452 continues to output a logic 0.

At reference 462, the differential input voltage becomes greater than the minimum differential voltage. Within the predetermined time period 480, the differential input voltage becomes less than the minimum differential voltage becomes less than the signal 452 continues to output a logic 0. At reference 466, the differential input voltage again becomes greater than the minimum differential voltage. After the predetermined time period 480 during which the differential input voltage continues to be greater than the minimum differential voltage, at reference 468, signal 452 transitions from logic 0 back to logic 1. At reference 470, the differential input voltage becomes less than the maximum differential voltage. After the predetermined time period 490 during which the differential input voltage continues to be less than the maximum differential voltage, at reference 472, signal 452 transitions from logic 1 back to logic 0.

Figure 5A:
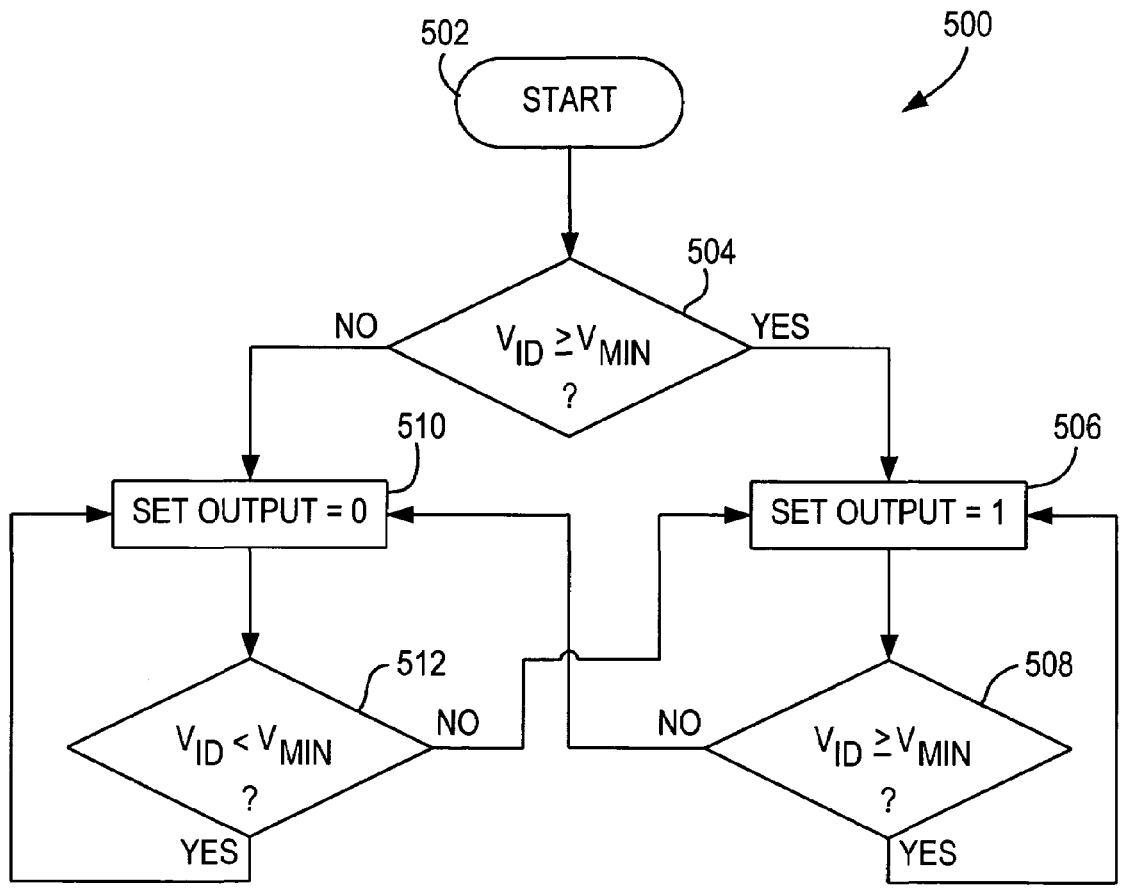
FIGS. 5A–B, 6A–B, and 7–8 are flow diagrams of illustrative processes for a signal detector in accordance with different embodiments of the invention.

FIG. 5A is a flow diagram of an illustrative process 500 for a signal detector in accordance with one embodiment of the invention (e.g., process 500 correlates with FIG. 3A). Process 500 begins at step 502. At step 504, process 500 determines whether the differential input voltage is greater than or equal to the minimum differential voltage. If the differential input voltage is greater than or equal to the minimum differential voltage, process 500 moves to step 506 where the output is set to logic 1 (e.g., signal 112 is set to logic 1). At step 508, process 500 determines whether the differential input voltage is still greater than or equal to the minimum differential voltage. If the differential input voltage is greater than or equal to the minimum differential voltage, process 500 returns to step 506.

If the differential input voltage is less than the minimum differential voltage at step 504 or step 508, process 500 moves to step 510 where the output is set to logic 0 (e.g., signal 112 is set to logic 0). At step 512, process 500 determines whether the differential input voltage is still less than the minimum differential voltage. If the differential input voltage is less than the minimum differential voltage, process 500 returns to step 510. If the differential input voltage is greater than or equal to the minimum differential voltage, process 500 returns to step 506.

Figure 5B:
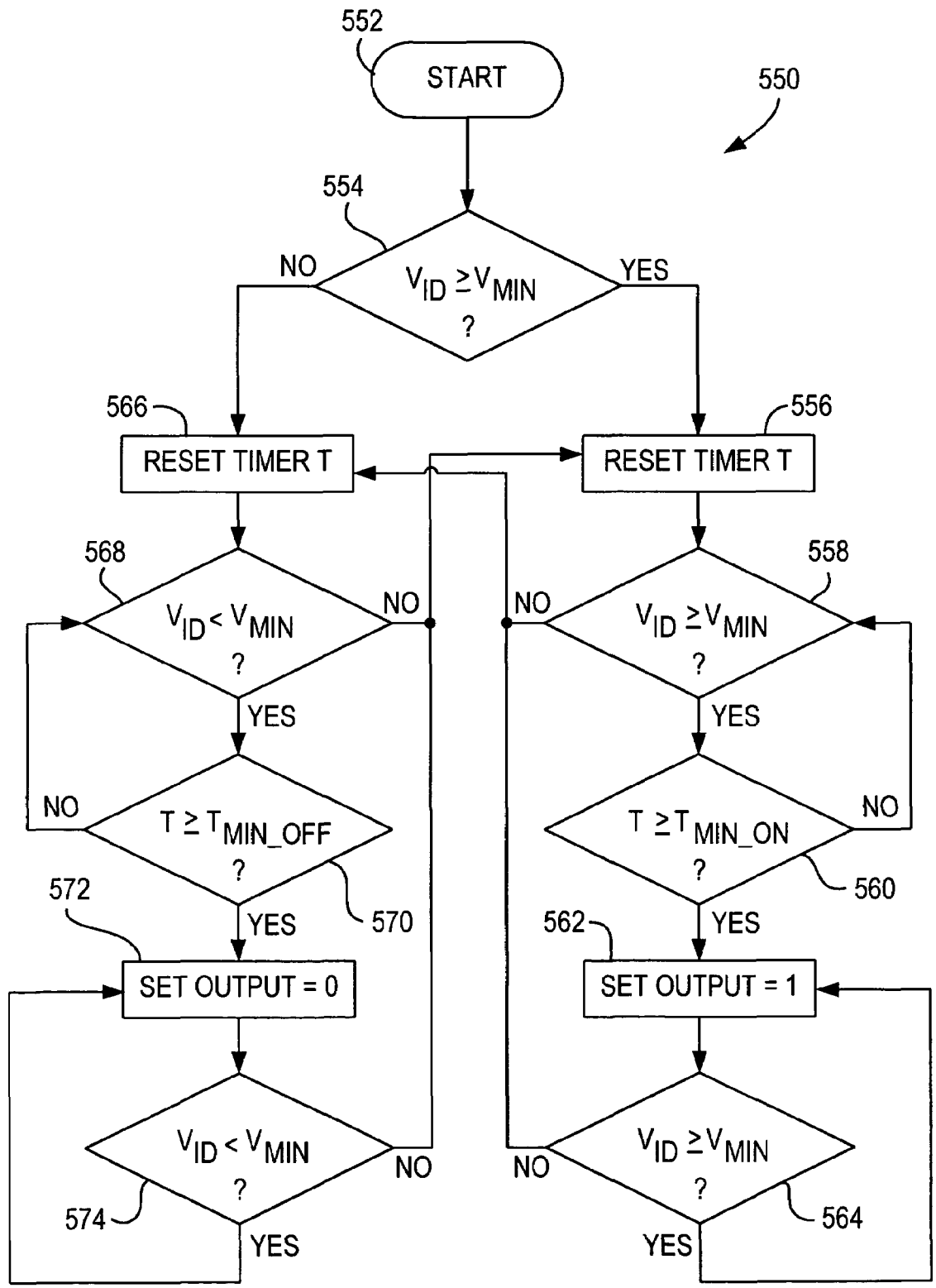

FIG. 5B is a flow diagram of an illustrative process 550 of a signal detector in accordance with another embodiment of the invention (e.g., process 550 correlates with FIG. 3B). Process 550 begins at step 552. At step 554, process 550 determines whether the differential input voltage is greater than or equal to the minimum differential voltage. If the differential input voltage is greater than or equal to the minimum differential voltage, process 550 moves to step 556 where a timer (T) is reset and initiated. At step 558, process 550 determines whether the differential input voltage is still greater than or equal to the minimum differential voltage. If the differential input voltage is greater than or equal to the minimum differential voltage, process 550 moves to step 560 where the process determines whether the timer is greater than or equal to a predetermined time period (e.g., $T_{MIN\_ON}$). If the timer is greater than or equal to a predetermined time period, process 550 moves to step 562 where the output is set to logic 1. If the timer is less than the predetermined time period, process 550 returns to step 558. After step 562, process 550 moves to step 564 where the process determines whether the differential input voltage is greater than or equal to the minimum differential voltage. If the differential input voltage is greater than or equal to the minimum differential voltage, process 550 returns to step 562.

If the differential input voltage is less than the minimum differential voltage at step 554, step 558, or step 564, process 550 moves to step 566 where the timer (T) is reset and initiated. At step 568, process 550 determines whether the differential input voltage is still less than the minimum differential voltage. If the differential input voltage is less than the minimum differential voltage, process 550 moves to step 570 where the process determines whether the timer is greater than or equal to a predetermined time period (e.g., $T_{MIN\_OFF}$). If the differential input voltage is greater than or equal to the minimum differential voltage, process 550 returns to step 556. If the timer is greater than or equal to the predetermined time period at step 570, process 550 moves to step 572 where the output is set to logic 0. If the timer is less than the predetermined time period at step 570, process 550 returns to step 568. After step 572, process 550 moves to step 574 where the process determines whether the differential input voltage is less than the minimum differential voltage. If the differential input voltage is less than the minimum differential voltage, process 550 returns to step 572. If the differential input voltage is greater than or equal to the minimum differential voltage, process 550 returns to step 556.

Figure 6A:
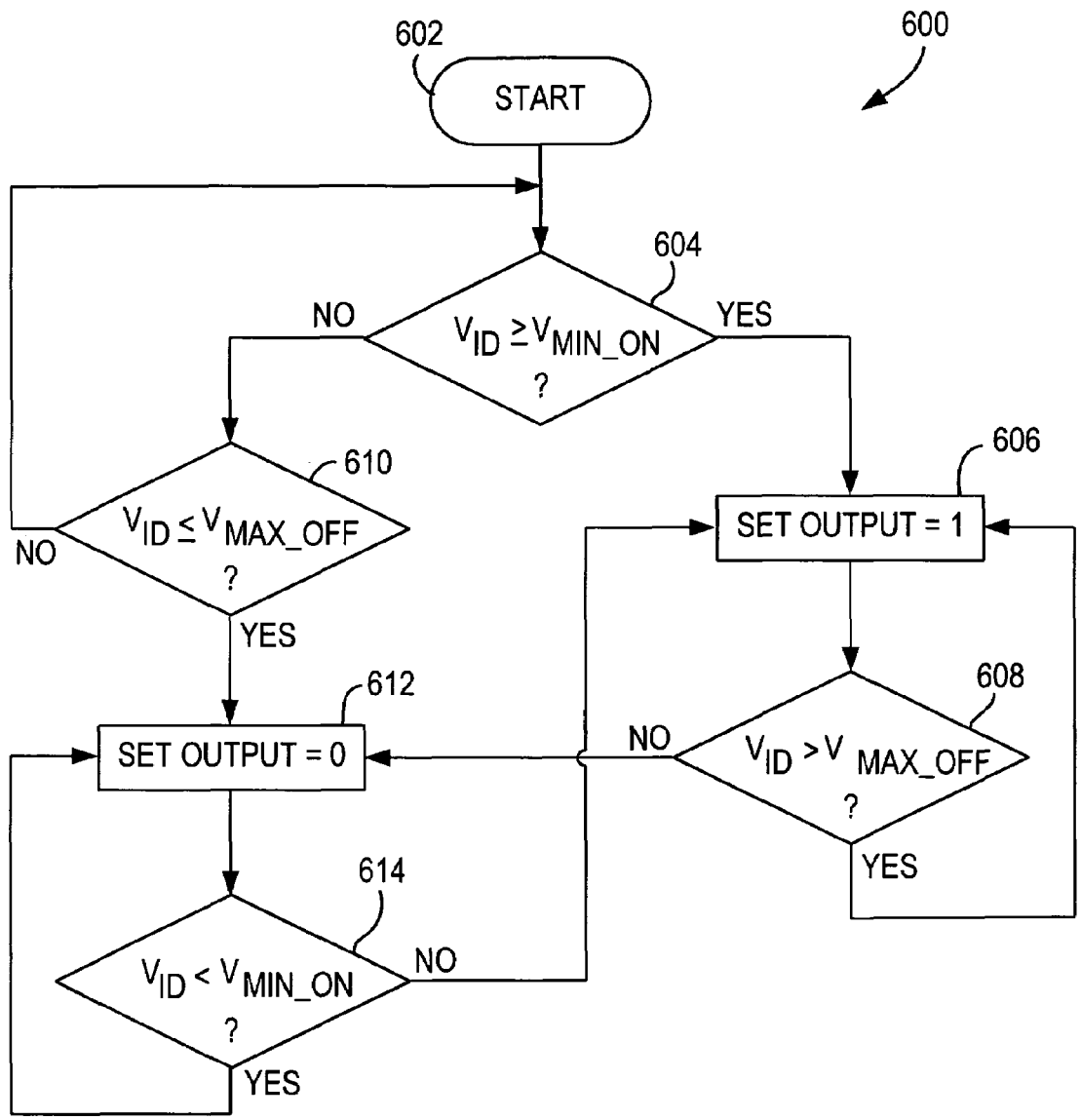

FIG. 6A is a flow diagram of an illustrative process 600 for a signal detector in accordance with yet another embodiment of the invention (e.g., process 600 correlates with FIG. 4A). Process 600 begins at step 602. At step 604, process 600 determines whether the differential input voltage is greater than or equal to the minimum differential voltage. If the differential input voltage is greater than or equal to the minimum differential voltage, process 600 moves to step 606 where the output is set to logic 1. At step 608, process 600 determines whether the differential input voltage is greater than the maximum differential voltage. If the differential input voltage is greater than the maximum differential voltage, process 600 returns to step 606.

If the differential input voltage is less than the minimum differential voltage at step 604, process 600 moves to step 610 where the process determines whether the differential input voltage is less than or equal to the maximum differential voltage. If the differential input voltage is less than or equal to the maximum differential voltage at step 610 or step 608, process 600 moves to step 612 where the output is set to logic 0. If the differential input voltage is greater than the maximum differential voltage at step 610, process 600 returns to step 604. After step 612, process 600 then moves to step 614 where the process determines whether the differential input voltage is less than the minimum differential voltage. If the differential input voltage is less than the minimum differential voltage, process 600 returns to step 612. If the differential input voltage is greater than or equal to the minimum differential voltage, process 600 returns to step 606.

Figure 6B:
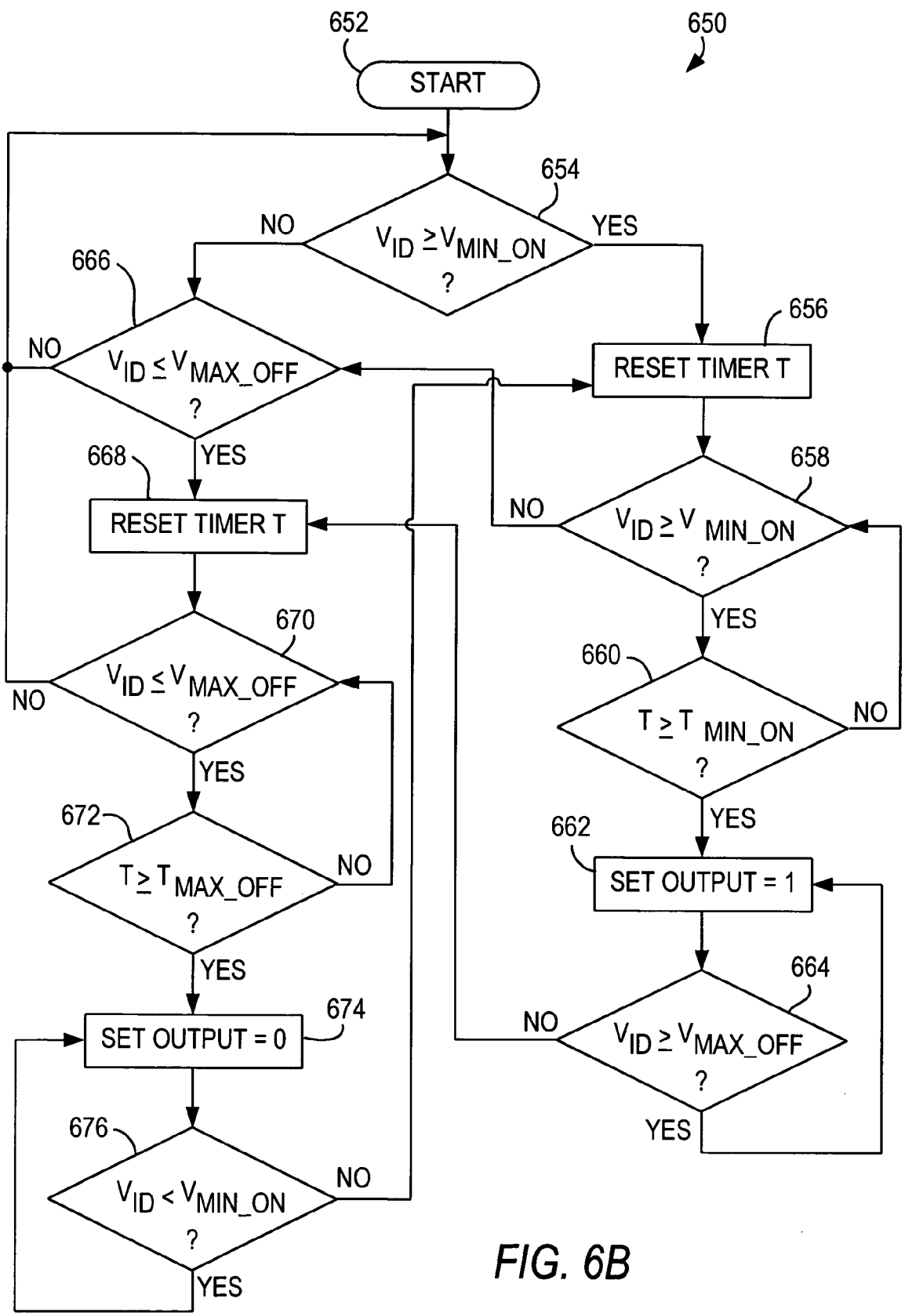

FIG. 6B is a flow diagram of an illustrative process 650 of a signal detector in accordance with a further embodiment of the invention (e.g., process 650 correlates with FIG. 4B). Process 650 begins at step 652. At step 654, process 650 determines whether the differential input voltage is greater than or equal to the minimum differential voltage. If the differential input voltage is greater than or equal to the minimum differential voltage, process 650 moves to step 656 where a timer (T) is reset and initiated. At step 658, process 650 determines whether the differential input voltage is still greater than or equal to the minimum differential voltage. If the differential input voltage is still greater than or equal to the minimum differential voltage, process 650 moves to step 660 where the process determines whether the timer is greater than or equal to a predetermined time period (e.g., $T_{MIN\_ON}$). If the timer is greater than or equal to a predetermined time period, process 650 moves to step 662 where the output is set to logic 1. If the timer is less than the predetermined time period, process 650 returns to step 658. After step 662, process 650 moves to step 664 where the process determines whether the differential input voltage is greater than the maximum differential voltage. If the differential input voltage is greater than the maximum differential voltage, process 650 returns to step 662.

If the differential input voltage is less than the minimum differential voltage at step 654 or step 658, process 650 moves to step 666 where the process determines whether the differential input voltage is less than or equal to the maximum differential voltage. If the differential input voltage is less than or equal to the maximum differential voltage at step 666 or step 664, process 650 moves to step 668 where the timer (T) is reset and initiated. If the differential input voltage is greater than the maximum differential voltage at step 666, process 650 returns to step 654. After step 668, process 650 moves to step 670 where the process determines whether the differential input voltage is still less than or equal to the maximum differential voltage. If the differential input voltage is still less than or equal to the maximum differential voltage, process 650 moves to step 672 where the process determines whether the timer is greater than or equal to a predetermined time period (e.g., $T_{MAX\_OFF}$). If the differential input voltage is greater than the maximum differential voltage at step 670, process 650 returns to step 654. If the timer is greater than or equal to the predetermined time period at step 672, process 650 moves to step 674 where the output is set to logic 0. If the timer is less than the predetermined time period at step 672, process 650 returns to step 670. After step 674, process 650 moves to step 676 where the process determines whether the differential input voltage is less than the minimum differential voltage. If the differential input voltage is less than the minimum differential voltage, process 650 returns to step 674. If the differential input voltage is greater than or equal to the minimum differential voltage, process 650 returns to step 656.

Figure 7:
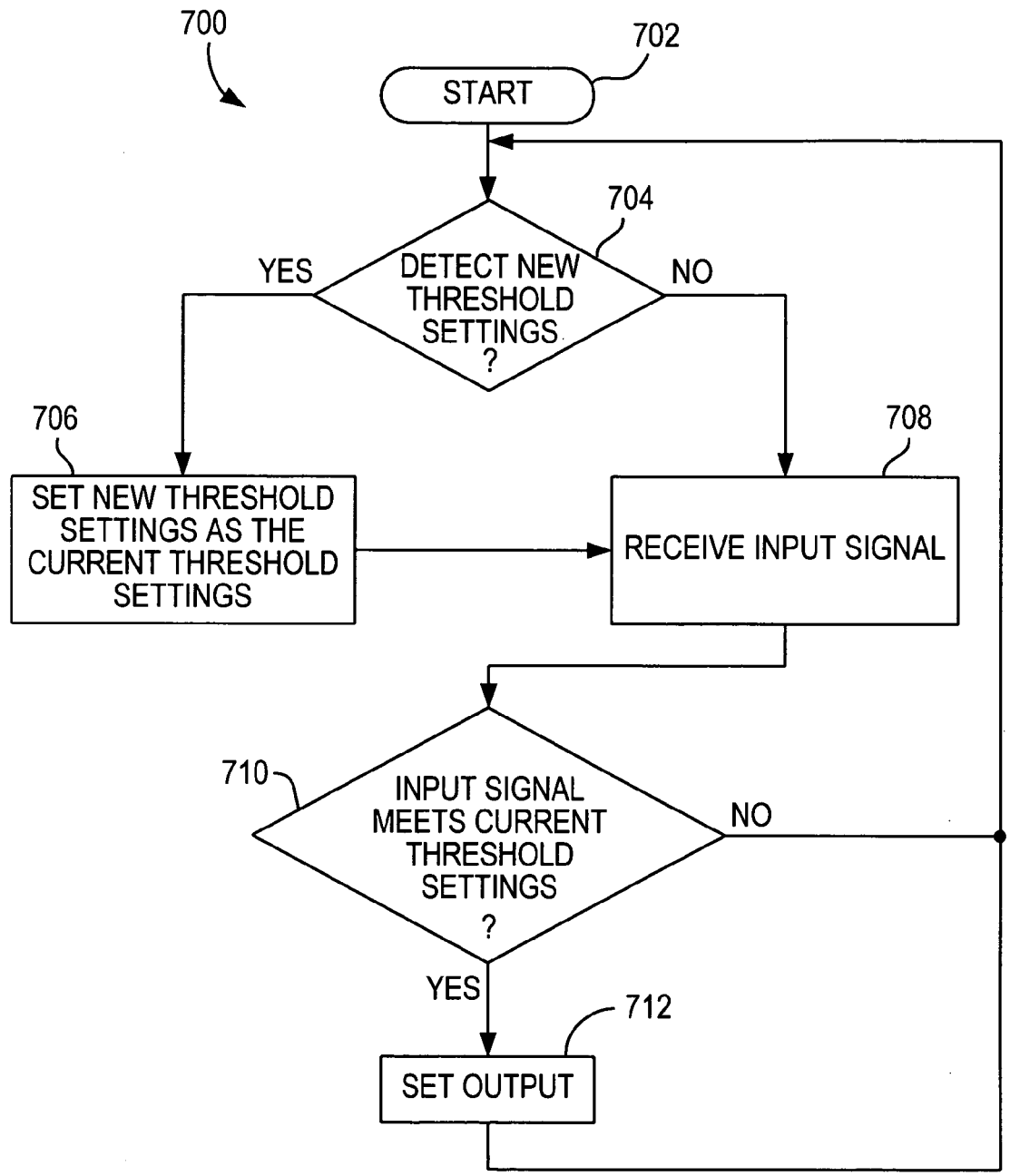

FIG. 7 is a flow diagram of an illustrative process 700 for a signal detector in accordance with yet another embodiment of the invention. Process 700 begins at step 702. At step 704, process 700 determines whether new threshold settings are detected. New threshold settings can include, for example, differential voltage, peak power, average power, and any other suitable setting or combination of settings. Alternatively or additionally, new threshold settings can include a change in value of a selected threshold setting such as, for example, a new value, an increment or decrement in value, or other suitable value. If new threshold settings are detected, process 700 moves to step 706 where the new threshold settings are set as the current threshold settings.

If new threshold settings are not detected at step 704 or after the new threshold settings are set as the current threshold settings at step 706, process 700 moves to step 708 where the process receives an input signal (e.g., signals 108 from circuit 106). At step 710, process 700 determines whether the input signal meets the current threshold settings (e.g., the differential input voltage is greater than or equal to a minimum differential voltage, the differential input voltage is less than or equal to a maximum differential voltage). If the current threshold settings are met, process 700 moves to step 712 where the output is set accordingly (e.g., output signal 112 transitions between logic 0 and logic 1). If the current threshold settings are not met at step 710 or after step 712, process 700 returns to step 704.

Figure 8:
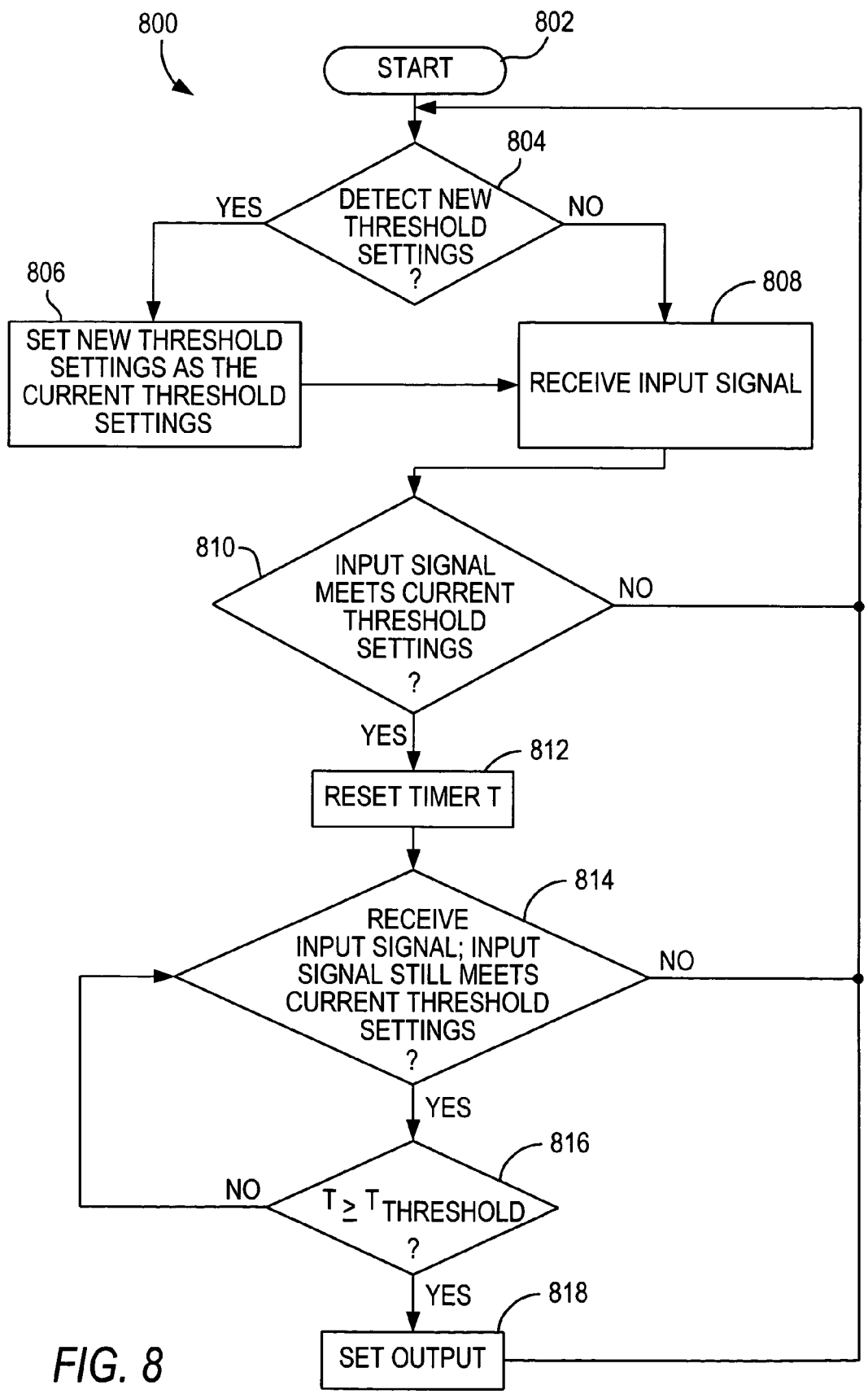

FIG. 8 is a flow diagram of an illustrative process 800 for a programmable signal detector in accordance with a further embodiment of the invention. Process 800 begins at step 802. At step 804, process 800 determines whether new threshold settings are detected. If new threshold settings are detected, process 800 moves to step 806 where the new threshold settings are set as the current threshold settings.

If new threshold settings are not detected at step 804 or after the new threshold settings are set as the current threshold settings at step 806, process 800 moves to step 808 where the process receives an input signal. At step 810, process 800 determines whether the input signal meets the current threshold settings. If the current threshold settings are met, process 800 moves to step 812 where a timer (T) is reset and initiated. If the current threshold settings are not met, process 800 returns to step 804. After step 812, process 800 moves to step 814 where the process receives a new input signal and determines whether the new input signal meets the current threshold settings. If the current threshold settings are met, process 800 moves to step 816 where the process determines whether the timer is greater than or equal to a predetermined time period (e.g., $T_{THRESHOLD}$). If the current threshold settings are not met, process 800 returns to step 804. If the timer is greater than or equal to the predetermined time period at step 816, process 800 moves to step 818 where the output is set accordingly (e.g., the output transitions between logic 0 and logic 1). If the timer is less than the predetermined time period, process 800 returns to step 814. After step 818, process 800 returns to step 804.

Figure 9:
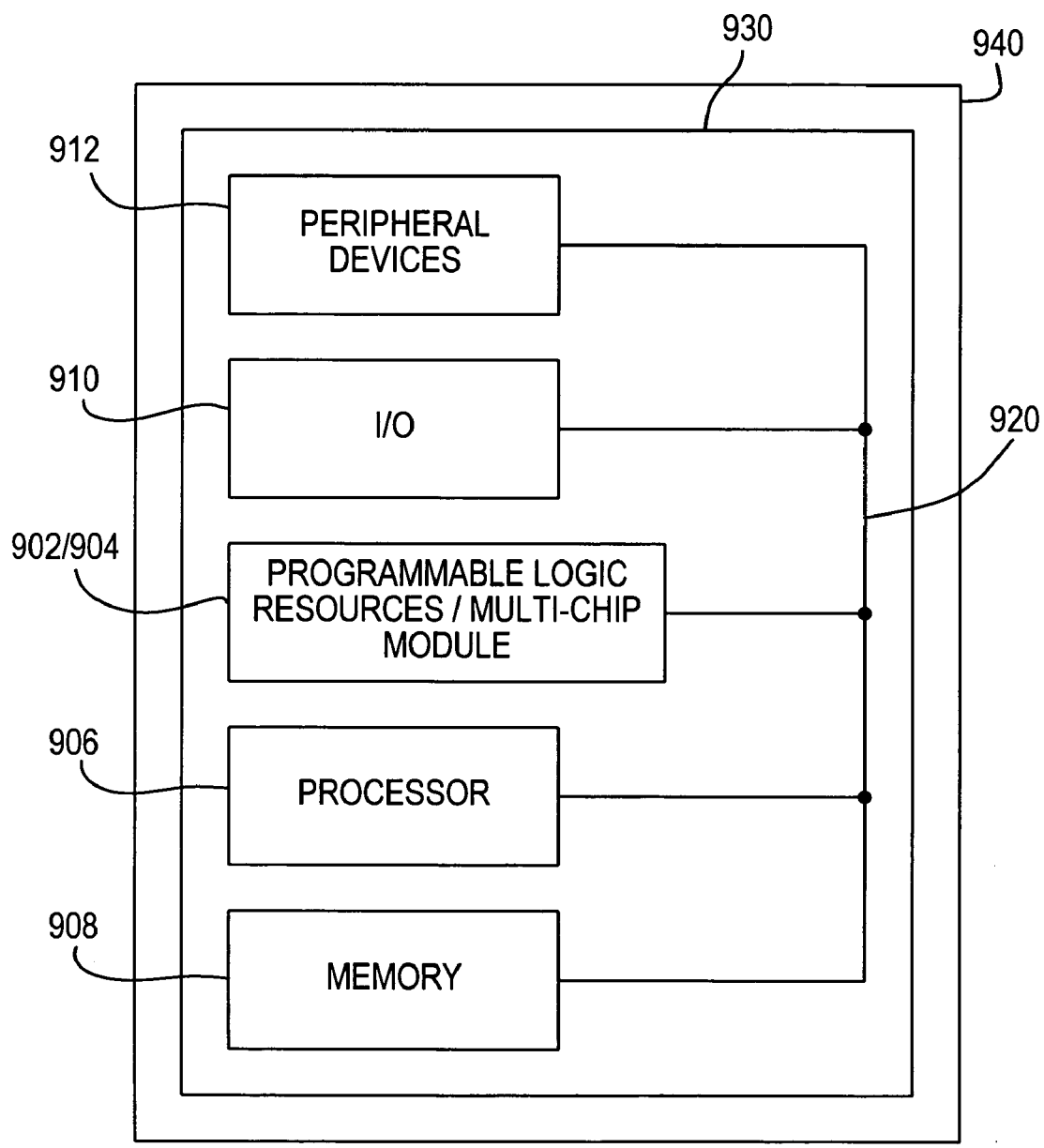
FIG. 9 is a simplified schematic block diagram of an illustrative system employing a programmable logic resource in accordance with the invention.

FIG. 9 illustrates a programmable logic resource 902 or multi-chip module 904 which includes embodiments of this invention in a data processing system 900. Data processing system 900 can include one or more of the following components: a processor 906, memory 908, I/O circuitry 910, and peripheral devices 912. These components are coupled together by a system bus or other interconnections 920 and are populated on a circuit board 930 which is contained in an end-user system 940.

System 900 can be used in a wide variety of applications, such as computer networking, data networking, instrumentation, video processing, digital signal processing, or any other application where the advantage of using programmable or reprogrammable logic is desirable. Programmable logic resource/module 902/904 can be used to perform a variety of different logic functions. For example, programmable logic resource/module 902/904 can be configured as a processor or controller that works in cooperation with processor 906. Programmable logic resource/module 902/904 may also be used as an arbiter for arbitrating access to a shared resource in system 900. In yet another example, programmable logic resource/module 902/904 can be configured as an interface between processor 906 and one of the other components in system 900. It should be noted that system 900 is only exemplary, and that the true scope and spirit of the invention should be indicated by the following claims.

Various technologies can be used to implement programmable logic resources 902 or multi-chip modules 904 having the features of this invention, as well as the various components of those devices (e.g., programmable logic connectors ("PLCs") and programmable function control elements ("FCEs") that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be a product term logic, implementing functions such as AND, NAND, OR, or NOR. Examples of components suitable for implementing PLCs include EPROMs, EEPROMS, pass transistors, transmission gates, antifuses, laser fuses, metal optional links, etc. PLCs and other circuit components may be controlled by various, programmable, function control elements ("FCEs"). For example, FCEs can be SRAMS, DRAMS, magnetic RAMS, ferro-electric RAMS, first-in first-out ("FIFO") memories, EPROMS, EEPROMs, function control registers, ferro-electric memories, fuses, antifuses, or the like. From the various examples mentioned above it will be seen that this invention is applicable to both one-time-only programmable and reprogrammable resources.

Thus it is seen that a dynamically adjustable signal detector is provided that supports different signaling protocols and adapts to changes in the link between the transmitter and receiver. One skilled in the art will appreciate that the invention can be practiced by other than the prescribed embodiments, which are presented for purposes of illustration and not of limitation, and the invention is limited only by the claims which follow.

What is claimed is:

1. Apparatus for determining when a differential input signal received from a transmitter is a valid signal, the apparatus comprising:
   a dynamically adjustable signal detector that receives as input the differential input signal and is operative to output a signal indicative of whether the differential input signal is a valid signal based on at least one threshold setting; and
   control circuitry that receives as input at least one control signal and is operative:
      to set the dynamically adjustable signal detector with the at least one threshold setting based on the at least one control signal, and
      to change the at least one threshold setting based on the at least one control signal that is set in response to detecting at least one predetermined condition.

2. The apparatus of claim 1 wherein the at least one threshold setting includes one of a differential voltage, peak power, and average power.

3. The apparatus of claim 1 wherein the dynamically adjustable signal detector determines whether the differential input signal meets the at least one threshold setting.

4. The apparatus of claim 3 wherein the dynamically adjustable signal detector:
   outputs a first logic value when the differential input signal meets the at least one threshold setting; and
   outputs a second logic value when the differential input signal does not meet the at least one threshold setting.

5. The apparatus of claim 3 wherein the dynamically adjustable signal detector:
   outputs a first logic value when the differential input signal meets the at least one threshold setting for a first predetermined time period; and
   outputs a second logic value when the differential input signal does not meet the at least one threshold setting for a second predetermined time period.

6. The apparatus of claim 1 wherein the at least one control signal is set by programmable logic resource circuitry.

7. The apparatus of claim 1 wherein the at least one control signal is set by circuitry external to a programmable logic resource.

8. The apparatus of claim 1 wherein the at least one control signal is set by user input.

9. The apparatus of claim 1 wherein the control circuitry that is operative to change the at least one threshold setting is further operative to set the dynamically adjustable signal detector with a new threshold setting based on the at least one control signal that is set in response to detecting a change in signaling protocol.

10. The apparatus of claim 1 wherein the control circuitry that is operative to change the at least one threshold setting is further operative to set the dynamically adjustable signal detector with a new threshold setting based on the at least one control signal that is set in response to detecting a change in a communications link between the transmitter and a receiver, wherein the change is due to one of component aging and changes in environmental conditions.

11. The apparatus of claim 1 further comprising:
a dynamically adjustable equalization circuit that receives as input the differential input signal and boosts high frequency components of the differential input signal for output to the dynamically adjustable signal detector.

12. A digital processing system comprising:
processing circuitry;
a memory coupled to the processing circuitry; and
apparatus as defined in claim 1 coupled to the processing circuitry and the memory.

13. A printed circuit board on which is mounted the apparatus as defined in claim 1.

14. The printed circuit board defined in claim 13 further comprising:
a memory mounted on the printed circuit board and coupled to the apparatus.

15. The printed circuit board defined in claim 13 further comprising:
processing circuitry mounted on the printed circuit board and coupled to the apparatus.

16. Apparatus for determining when a differential input signal received from a transmitter is a valid signal, the apparatus comprising:
a dynamically adjustable signal detector that receives as input the differential input signal and is operative to output a signal indicative of whether the differential input signal is a valid signal based on a differential voltage threshold; and
control circuitry that receives as input at least one control signal and is operative:
to set the dynamically adjustable signal detector with the differential voltage threshold based on the at least one control signal, and
to change the differential voltage threshold based on the at least one control signal that is set in response to detecting at least one predetermined condition.

17. The apparatus of claim 16 wherein the dynamically adjustable signal detector computes a difference between a positive terminal and a negative terminal of the differential input signal to produce a differential input voltage.

18. The apparatus of claim 17 wherein the dynamically adjustable signal detector:
outputs a first logic value when the differential input voltage is greater than or equal to the differential voltage threshold; and
outputs a second logic value when the differential input voltage is less than the differential voltage threshold.

19. The apparatus of claim 17 wherein the dynamically adjustable signal detector:
outputs a first logic value when the differential input voltage is greater than or equal to the differential voltage threshold for a first predetermined time period; and outputs a second logic value when the differential input voltage is less than the differential voltage threshold for a second predetermined time period.

20. The apparatus of claim 16 wherein the at least one control signal includes a value for the differential voltage threshold.

21. The apparatus of claim 16 wherein the at least one control signal is indicative of whether the differential voltage threshold is to be increased or decreased.

22. The apparatus of claim 16 wherein the at least one control signal has a value that corresponds to the differential threshold stored in a lookup table in the control circuitry.

23. The apparatus of claim 16 wherein the at least one control signal is set by programmable logic resource circuitry.

24. The apparatus of claim 16 wherein the at least one control signal is set by circuitry external to a programmable logic resource.

25. The apparatus of claim 16 wherein the at least one control signal is set by user input.

26. A method for determining when a differential input signal received from a transmitter is a valid signal, the method comprising:
receiving a new value for a differential voltage threshold;
computing a difference between a positive terminal and a negative terminal of the differential input signal to produce a differential input voltage;
comparing the differential input voltage to the new value for the differential voltage threshold; and
sending an output indicative of whether the differential input signal is valid in response to comparing the differential input voltage to the new value for the differential voltage threshold.

27. The method of claim 26 wherein the new value for the differential voltage threshold is dynamically adjustable.

28. The method of claim 26 further comprising:
sending as output a first logic value when the differential input voltage is greater than or equal to the differential voltage threshold; and
sending as output a second logic value when the differential input voltage is less than the differential voltage threshold.

29. The method of claim 26 further comprising:
sending as output a first logic value when the differential input voltage is greater than or equal to the differential voltage threshold for a first predetermined time period; and
sending as output a second logic value when the differential input voltage is less than the differential voltage threshold for a second predetermined time period.

* * * * *